(12) United States Patent
Kim et al.

(10) Patent No.: US 12,713,717 B2
(45) Date of Patent: Aug. 18, 2026

(54) IMAGE SENSOR AND IMAGE PROCESSING DEVICE INCLUDING THE SAME

(71) Applicant: SAMSUNG ELECTRONICS CO., LTD., Suwon-si (KR)

(72) Inventors: Dong Hyun Kim, Hwaseong-si (KR); Yong Sang Park, Seoul (KR); Hae Yong Park, Yongin-si (KR); Jong Eun Park, Seongnam-si (KR); Kwan Sik Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 808 days.

(21) Appl. No.: 17/507,973

(22) Filed: Oct. 22, 2021

(65) Prior Publication Data

US 2022/0139993 A1 May 5, 2022

(30) Foreign Application Priority Data

Nov. 5, 2020 (KR) ........................ 10-2020-0146784

(51) Int. Cl.

*H10F 39/18* (2025.01)
*H10F 39/00* (2025.01)
*H10F 39/15* (2025.01)

(52) U.S. Cl.

CPC ........... *H10F 39/18* (2025.01); *H10F 39/153* (2025.01); *H10F 39/8037* (2025.01); *H10F 39/807* (2025.01); *H10F 39/811* (2025.01)

(58) Field of Classification Search

CPC .... H10F 39/18; H10F 39/153; H10F 39/8037; H10F 39/807; H10F 39/811; H10F 39/182; H10F 39/8053; H10F 39/8033

See application file for complete search history.

(56) References Cited

U.S. PATENT DOCUMENTS

| | | | | |
|---|---|---|---|---|
| 7,205,584 | B2 | 4/2007 | Rhodes et al. | |
| 8,013,365 | B2 | 9/2011 | Ko et al. | |
| 9,054,003 | B2 * | 6/2015 | Ahn | H10F 39/807 |
| 9,240,345 | B2 | 1/2016 | Sung | |
| 9,420,209 | B2 | 8/2016 | Ahn et al. | |
| 9,508,771 | B2 * | 11/2016 | Lee | H10D 64/513 |
| 10,431,619 | B2 | 10/2019 | Masagaki et al. | |
| 2020/0091218 | A1 | 3/2020 | Ikakura et al. | |

FOREIGN PATENT DOCUMENTS

| | | | |
|---|---|---|---|
| JP | 2016-039315 | A | 3/2016 |
| KR | 10-2004-0093997 | A | 11/2004 |
| KR | 10-0689592 | B1 | 3/2007 |
| KR | 10-2013-0128992 | A | 11/2013 |
| KR | 10-2020-0092044 | A | 8/2020 |

* cited by examiner

*Primary Examiner* — David Vu

(74) *Attorney, Agent, or Firm* — Muir Patent Law, PLLC

(57) ABSTRACT

An image sensor includes a substrate having an element separation pattern, a first active region, and a ground region, the ground region being separated from the first active region by the element separation pattern, a transfer transistor including a transfer gate electrode on the first active region, the transfer gate electrode being separated from the ground region by the element separation pattern, a photo diode within the substrate, the photo diode being spaced apart from the transfer gate electrode, and a contact on the ground region, the contact being configured to receive a ground voltage.

18 Claims, 15 Drawing Sheets

FIG. 8

APS(SAR)
OB(SAR)
CR
PR
ER
100
200
A
PD
IS1
IS2
TR1
TR2

APS(SAR)
OB(SAR)
CR
PR
ER
A
A
100
200
PD
180
170
165
160
140
110
120t
TR1
132
130
232
230
TR2
210
185
120
122
124
350
355t
355
380
455t
460
450
134
234
555t
555
550t
560
550
185
380
165
110a
115t
115
110b
IS1
236
IS2
210a
210b

IMAGE SENSOR AND IMAGE PROCESSING DEVICE INCLUDING THE SAME

CROSS-REFERENCE TO RELATED APPLICATION

Korean Patent Application No. 10-2020-0146784, filed on Nov. 5, 2020 in the Korean Intellectual Property Office, and entitled: "Image Sensor and Image Processing Device Including the Same," is incorporated by reference herein in its entirety.

BACKGROUND

1. Field

The present disclosure relates to an image sensor and an image processing device including the same.

2. Description of the Related Art

An image sensor is one of semiconductor elements that convert optical information into an electric signal. For example, the image sensor may include a charge coupled device (CCD) image sensor and a complementary metal-oxide semiconductor (CMOS) image sensor.

The image sensor may be configured in the form of a package. At this time, the package may be configured as a structure that protects the image sensor and allows light to enter a photo receiving surface or a sensing region of the image sensor. For example, in a backside illumination (BSI) image sensor, light enters through a back side of a semiconductor substrate, so that pixels formed in the image sensor have improved light reception efficiency and sensitivity.

SUMMARY

Aspects of the present disclosure provide an image sensor that includes a substrate which includes an element separation pattern, a first active region and a ground region separated by the element separation pattern, a transfer transistor including a transfer gate electrode placed on the first active region, a photo diode placed in the substrate to be spaced apart from the transfer gate electrode, and a contact which is placed on the ground region and to which a ground voltage is provided, wherein the ground region is separated from the transfer gate electrode by the element separation pattern.

Aspects of the present disclosure also provide an image sensor that includes a substrate, a first pixel region which is formed on the substrate, and includes a first active region, a second active region, and a first ground region separated by a first element separation pattern, a first transfer transistor which includes a first transfer gate electrode at least partially extending into the substrate, on the first active region, a first photo diode placed in the substrate to be spaced part from the first transfer gate electrode, a source follower transistor which has one end connected to a power supply voltage terminal, and a gate connected to a floating diffusion region, on the second active region, and a selection transistor which is placed on the second active region to be spaced apart from the source follower transistor, and has one end connected to the other end of the source follower transistor, and a contact which is placed on the first ground region and to which a ground voltage is provided, wherein the first ground region is separated from the first transfer gate electrode by the element separation pattern.

Aspects of the present disclosure also provide an image processing device that includes an image sensor which includes a plurality of pixel regions having a photo diode for generating electric charge from light, and generates a pixel signal from the electric charge generated by the photo diode, and an image processor which generates image data from the pixel signal, wherein the image sensor incudes a substrate including an element separation pattern, an active region and a ground region separated by the element separation pattern, a transfer transistor including a transfer gate electrode which at least partially extends into the substrate and overlaps the photo diode, and a contact which is placed on the ground region and to which a ground voltage is provided, the element separation pattern surrounds the active region or the ground region, and the ground region is separated from the transfer gate electrode by the element separation pattern.

BRIEF DESCRIPTION OF THE DRAWINGS

Features will become apparent to those of skill in the art by describing in detail exemplary embodiments with reference to the attached drawings, in which:

FIG. 8 is a cross-sectional view along line B-B' of FIG. 6;

DETAILED DESCRIPTION

Figure 1:
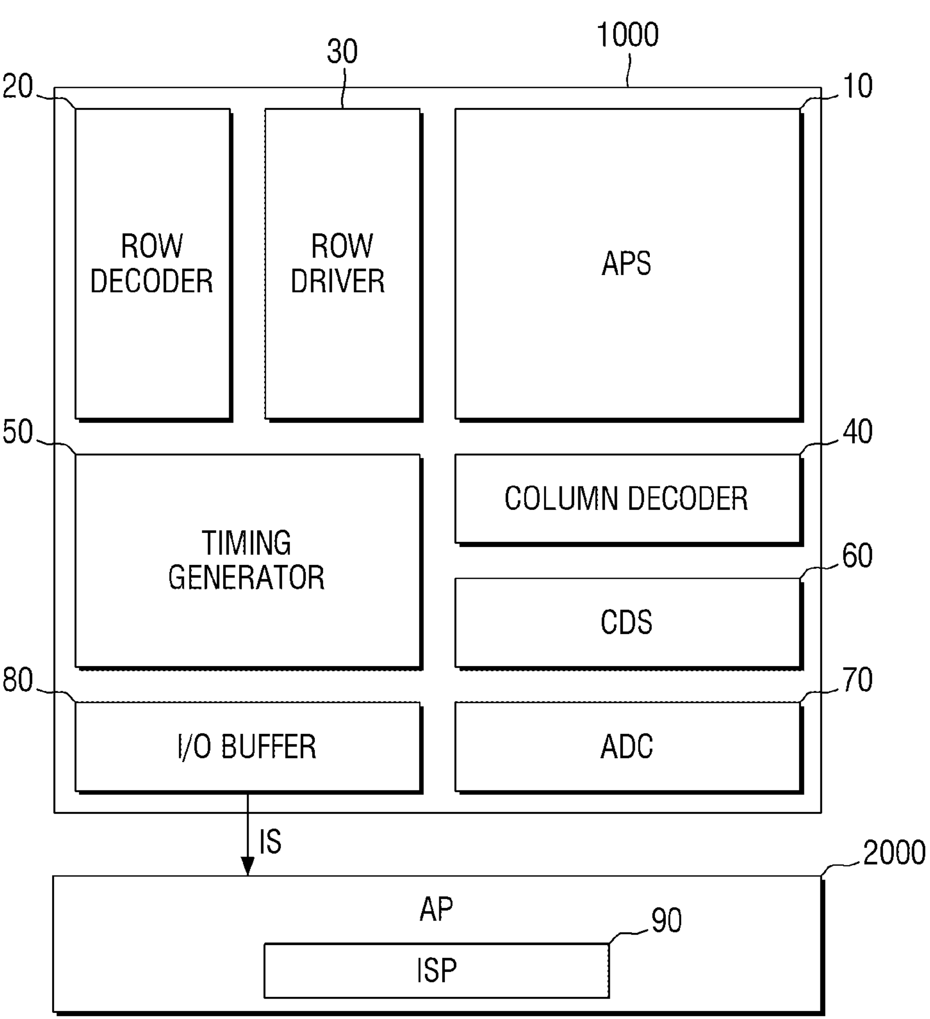
FIG. 1 is a block diagram of an image processing device according to some embodiments.

FIG. 1 is a block diagram of an image processing device according to some embodiments.

Referring to FIG. 1, the image processing device according to some embodiments may include an image sensor 1000 and an application processor 2000. The image processing device may include one of electronic devices that acquire an external image, e.g., a smart phone, a digital camera, etc.

The image sensor 1000 may convert an externally provided optical signal into an electrical signal. The image sensor 1000 may include a plurality of unit pixels. For example, each unit pixel of the image sensor 1000 may receive light reflected from an external object and convert the received light into an electrical image signal or a photographic signal. The image sensor 1000 may include an active pixel sensor array 10, a row decoder 20, a row driver 30, a column decoder 40, a timing generator 50, a correlated double sampler (CDS) 60, an analog-to-digital converter (ADS) 70, and an input/output buffer (I/O Buffer) 80.

The active pixel sensor array (APS) 10 may include a plurality of unit pixels arranged two-dimensionally, and may convert an optical signal into an electric signal. The APS 10 may be driven by the plurality of drive signals from the row driver 30, e.g., a pixel selection signal, a reset signal, a charge transmission signal, etc. Also, the electrical signal converted by the APS 10 may be provided to the CDS 60.

The row driver 30 may provide a large number of drive signals for driving the plurality of unit pixels according to the result decoded by the row decoder 20 to the APS 10. When the unit pixels are arranged in the form of a matrix, the drive signals may be provided for each row. The timing generator 50 may provide a timing signal and a control signal to the row decoder 20 and the column decoder 40.

The CDS 60 may receive, hold and sample the electrical signals generated by the active pixel sensor array 10. The CDS 60 may doubly sample a specific noise level and the signal level due to the electrical signal, and output a difference level corresponding to a difference between the noise level and the signal level. The ADC 70 may convert the analog signal corresponding to the difference level, which is output from the CDS 60, into a digital signal and output the digital signal.

The I/O buffer 80 latches the digital signal, and the latched signal may be sequentially output to the application processor 2000 according to the decoding result from the column decoder 40. The latched signal may be, e.g., an image signal IS.

The image signal IS may be provided to the application processor 2000 and processed therein. That is, the image signal IS may be provided to the image signal processor (ISP) 90 included in the application processor 2000 and processed therein. The ISP 90 may process or treat the image signal IS to be easily displayed.

In some embodiments, the image sensor 1000 and the application processor 2000 may be placed separately as shown. For example, the image sensor 1000 may be mounted on a first chip and the application processor 2000 may be mounted on a second chip to communicate with each other through an interface. However, embodiments are not limited thereto, e.g., the image sensor 1000 and the application processor 2000 may be implemented as a single package (e.g., a multi-chip package (MCP)).

Figure 2:
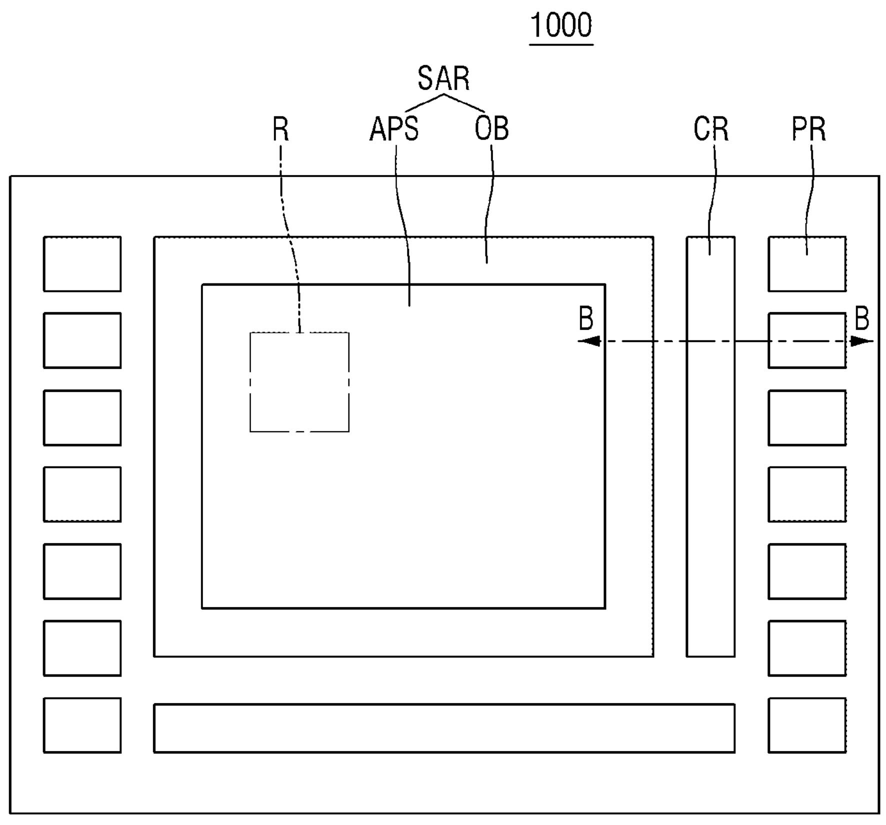
FIG. 2 is an exemplary layout diagram of an image sensor according to some embodiments.
Figure 3:
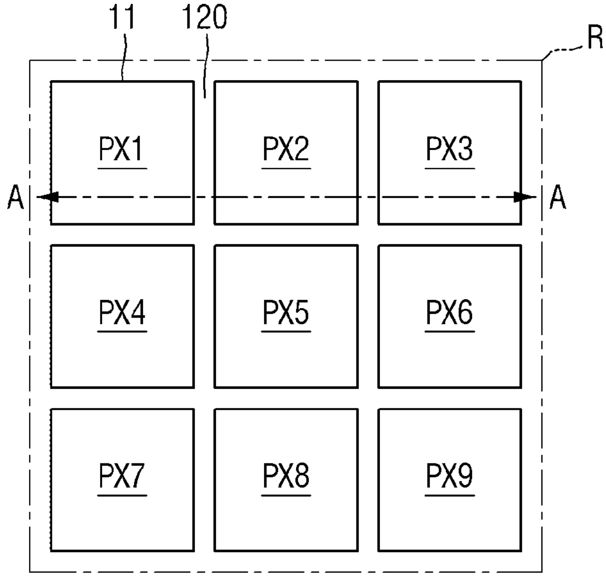
FIG. 3 is an enlarged view of region R of FIG. 2.

FIG. 2 is an exemplary layout diagram of the image sensor 1000. FIG. 3 is an enlarged view of region R of FIG. 2.

Referring to FIGS. 2 and 3, the image sensor 1000 according to some embodiments may include a sensor array region SAR, a connection region CR, and a pad region PR.

The sensor array region SAR may include the APS 10 of FIG. 1, e.g., the sensor array region SAR may include the APS 10 of FIG. 1 (hereinafter referred to as a light-receiving region APS) and a light-shielding region OB surrounding the light-receiving region APS. For example, a plurality of unit pixels 11 arranged two-dimensionally (for example, in the form of a matrix) may be formed in the sensor array region SAR. For example, a plurality of unit pixels PX1 to PX9 may be arranged in region R, as illustrated in FIG. 3, and may be separated from each other by the pixel separation pattern 120.

The pixel separation pattern 120 may define each of the unit pixels 11, e.g., unit pixels PX1 to PX9, in the sensor array region SAR. For example, the pixel separation pattern 120 may be formed along the periphery of each of the plurality of unit pixels 11, e.g., each of the unit pixels PX1 to PX9.

The sensor array region SAR may include the light-receiving region APS and the light-shielding region OB. Active pixels that receive light to generate an active signal may be arranged in the light-receiving region APS. Optical black pixels that block light to generate an optical black signal may be arranged in the light-shielding region OB. Although the light-shielding region OB may be formed, e.g., along the periphery of the light-receiving region APS, this is only an example. In some embodiments, dummy pixels may be formed in the light-receiving region APS adjacent to the light-shielding region OB.

The connection region CR may be formed around the sensor array region SAR. Although the connection region CR may be formed on one side of the sensor array region SAR, this is only an example. Wirings are formed in the connection region CR and may be configured to transmit and receive electrical signals of the sensor array region SAR.

The pad region PR may be formed around the sensor array region SAR. Although the pad region PR may be formed adjacent to the edge of the image sensor according to some embodiments, this is only an example. The pad region PR may be configured to be connected to an external device or the like to transmit and receive electrical signals between the image sensor according to some embodiments and the external device.

In FIG. 2, although the connection region CR is shown as being interposed between the sensor array region SAR and the pad region PR, this is only an example. The placement, e.g., relative configuration, of the sensor array region SAR, the connection region CR, and the pad region PR may vary as needed.

Figure 4:
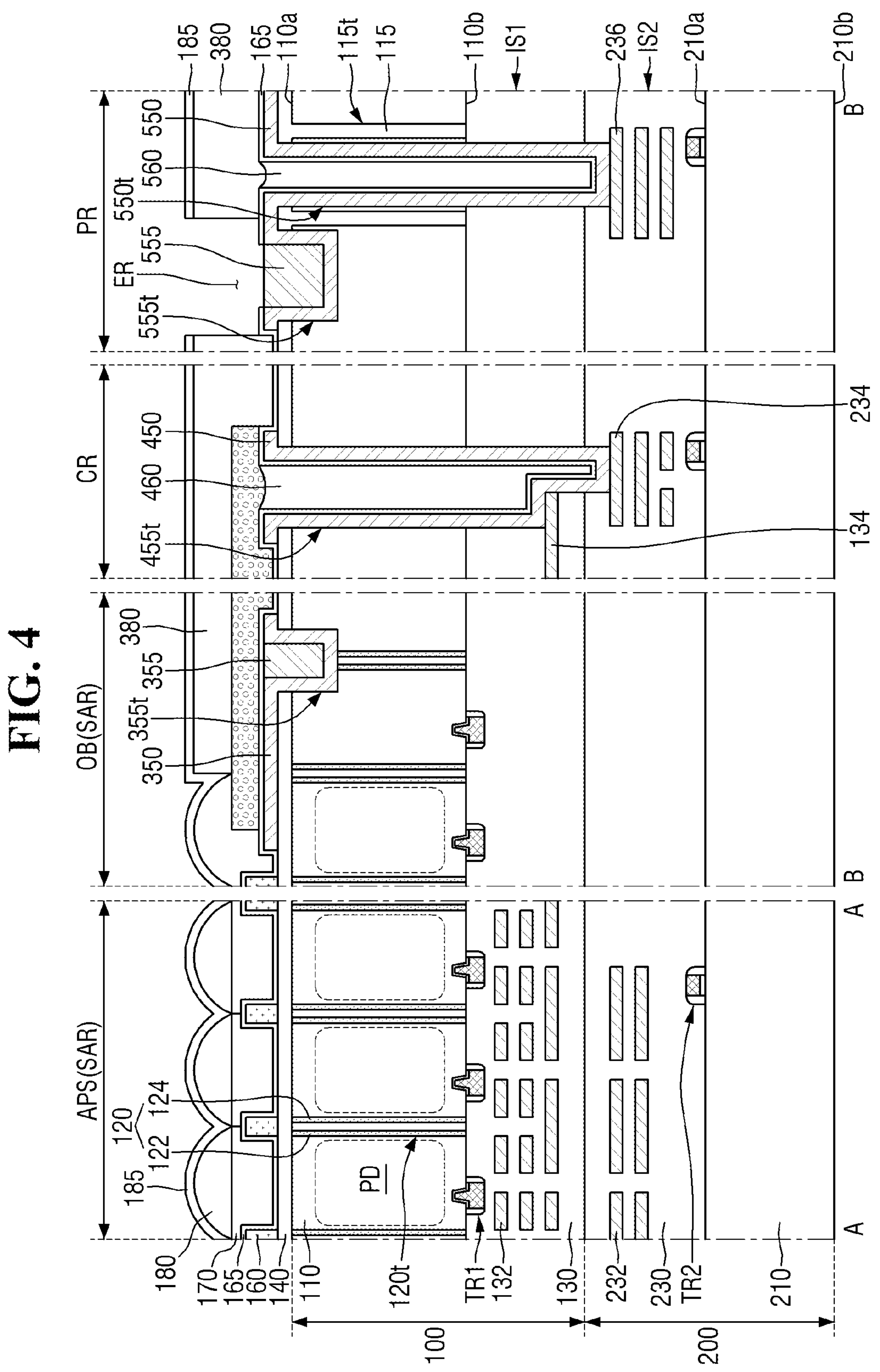
FIG. 4 is a cross-sectional view along line A-A of FIG. 3 and line B-B of FIG. 2.

FIG. 4 is a cross-sectional view taken along line A-A of FIG. 3 and line B-B of FIG. 2. Referring to FIG. 4, the image sensor according to some embodiments may include a first substrate 110, the pixel separation pattern 120, a first wiring structure IS1, a second substrate 210, a second wiring structure IS2, a surface insulating film 140, a conductor contact 150, a color filter 170, a grid pattern 160, and a microlens 180.

The first substrate 110 may be a semiconductor substrate. For example, the first substrate 110 may be bulk silicon or SOI (silicon-on-insulator). The first substrate 110 may be a silicon substrate or may include other materials, e.g., silicon germanium, indium antimonide, lead tellurium compounds, indium arsenic, indium phosphide, gallium arsenide or gallium antimonide. Alternatively, the first substrate 110 may have an epitaxial layer formed on a base substrate.

The first substrate 110 may include a first face 110*a* and a second face 110*b* that are opposite to each other. In embodiments to be described below, the first face 110*a* may be referred to as a back side of the first substrate 110, e.g., a surface facing the microlens 180, and the second face 110*b* may be referred to as a front side of the first substrate 110, e.g., a surface facing second substrate 210. In some embodiments, the first face 110*a* of the first substrate 110 may be a photo receiving surface on which light is incident. That is, the image sensor 1000 according to some embodiments may be a backside illumination (BSI) image sensor.

A plurality of unit pixels may be formed on the first substrate 110 of the sensor array region SAR, e.g., in the light-receiving region APS. For example, the plurality of pixels PX1 to PX9 arranged two-dimensionally, e.g., in the form of a matrix, as viewed from a planar viewpoint are illustrated in region R of the light-receiving region APS.

Each unit pixel may include a photo diode PD. The photo diode PD may be formed in the first substrate 110 of the light-receiving region APS. The photo diode PD may generate electric charge in proportion to an amount of light which is incident from the outside. For example, the photo diode PD may not be formed in a part of the light-shielding region OB. In another example, the photo diode PD may be formed in the first substrate 110 of the light-shielding region OB adjacent to the light-receiving region APS, but may not be formed in the first substrate 110 of the light-shielding region OB separated from the light-receiving region APS. The photo diode PD may include, e.g., at least one of a photo diode, a photo transistor, a photo gate, a pinned photo diode, an organic photo diode, a quantum dot, and/or a combination thereof.

Each unit pixel may include a first electronic element TR1. In some embodiments, the first electronic element TR1 may be formed on the second face 110*b* of the first substrate 110. The first electronic element TR1 may be connected to the photo diode PD to constitute various transistors for processing electrical signals. For example, the first electronic element TR1 may constitute transistors, e.g., a transfer transistor TG1, a reset transistor RG, a source follower transistor SF, or a selection transistor SEL of FIG. 5, which will be described later.

The pixel separation pattern 120 may be formed in the first substrate 110 of the sensor array region SAR. For example, the pixel separation pattern 120 may be formed by burying an insulating material in a deep trench (a first trench 120*t*) formed by patterning the first substrate 110.

The pixel separation pattern 120 may define a plurality of unit pixels. The pixel separation pattern 120 may be formed in a grid pattern, as viewed from a planar viewpoint, and may separate the plurality of unit pixels, e.g., unit pixels PX1 to PX9, from each other.

In some embodiments, the pixel separation pattern 120 may penetrate the first substrate 110. For example, as shown in FIG. 4, the pixel separation pattern 120 may extend from the first face 110*a* to the second face 110*b*, e.g., through an entire thickness of the first substrate 110.

In some embodiments, the pixel separation pattern 120 may include an insulating spacer film 122 and a filling conductive film 124. For example, the first trench 120*t* may be formed in the first substrate 110. The insulating spacer film 122 may extend along the side faces of the first trench 120*t*, and the filling conductive film 124 may be formed on the insulating spacer film 122 to fill the remaining region of the first trench 120*t*.

In some embodiments, the insulating spacer film 122 may include an oxide film having a lower refractive index than the first substrate 110. For example, the insulating spacer film 122 may include at least one of silicon oxide, aluminum oxide, tantalum oxide, and combinations thereof. The insulating spacer film 122, which has a lower refractive index than the first substrate 110, may refract or reflect light which is obliquely incident on the photo diode PD. Also, the insulating spacer film 122 may prevent the light charges generated in a specific unit pixel due to the incident light from moving to the adjacent unit pixel by a random drift. That is, the insulating spacer film 122 may improve the light receiving rate of the photo diode PD to improve the quality of the image sensor according to some embodiments.

In some embodiments, the filling conductive film 124 may include a conductive material. For example, the filling conductive film 124 may include polysilicon (poly Si). In some embodiments, a ground voltage or a negative voltage may be applied to the filling conductive film 124 including the conductive material. Therefore, it is possible to effectively prevent an ESD (electrostatic discharge) bruise defect of the image sensor according to some embodiments. Here, the ESD bruise defect means a phenomenon in which the electric charges generated by ESD or the like are accumulated on the surface of the substrate (e.g., the first face 110*a*) to cause a bruise-like defect on the generated image.

The first wiring structure IS1 may be formed on the first substrate 110. For example, the first wiring structure IS1 may cover the second face 110*b* of the first substrate 110. The first substrate 110 and the first wiring structure IS1 may constitute the first substrate structure 100.

The first wiring structure IS1 may be made up of one or more wirings. For example, the first wiring structure IS1 may include a first inter-wiring insulating film 130, and a plurality of wirings 132 and 134 in the first inter-wiring insulating film 130. In FIG. 4, the number of wiring layers constituting the first wiring structure IS1 and the arrangement thereof are merely examples. The first inter-wiring insulating film 130 may include, e.g., at least one of silicon oxide, silicon nitride, silicon oxynitride, and a low dielectric constant (low-k) material having a lower dielectric constant than silicon oxide.

For example, the first wiring structure IS1 may include a first wiring 132 in the sensor array region SAR, and a second wiring 134 in the connection region CR. The first wiring 132 may be electrically connected to a unit pixel of the sensor array region SAR. For example, the first wiring 132 may be connected to the first electronic element TR1. The second wiring 134 may extend from the sensor array region SAR. For example, the second wiring 134 may be electrically connected to at least a part of the first wiring 132. Therefore, the second wiring 134 may be electrically connected to the unit pixel of the sensor array region SAR. The first wiring 132 and the second wiring 134 may independently include, e.g., at least one of tungsten (W), copper (Cu), aluminum (Al), gold (Au), silver (Ag), and alloys thereof.

The second substrate 210 may be bulk silicon or SOI (silicon-on-insulator). The second substrate 210 may be a silicon substrate or may include other materials, e.g., silicon germanium, indium antimonide, lead tellurium compounds, indium arsenic, indium phosphide, gallium arsenide or gallium antimonide. Alternatively, the second substrate 210 may have an epitaxial layer formed on the base substrate.

The second substrate 210 may include a third face 210*a* and a fourth face 210*b* that are opposite to each other. In some embodiments, the third face 210*a* of the second substrate 210 may be a surface that faces the second face 110*b* of the first substrate 110.

A plurality of electronic elements may be formed on the second substrate 210. For example, the second electronic element TR2 may be formed on the third face 210*a* of the second substrate 210. The second electronic element TR2 is electrically connected to the sensor array region SAR and may transmit and receive electrical signals to and from each unit pixel of the sensor array region SAR. For example, the second electronic element TR2 may include electronic elements that make up the row decoder 20, the row driver 30, the column decoder 40, the timing generator 50, the CDS 60, the ADC 70 or the I/O buffer 80 of FIG. 1.

The second wiring structure IS2 may be formed on the second substrate 210. For example, the second wiring structure IS2 may cover the third face 210*a* of the second substrate 210. The second substrate 210 and the second wiring structure IS2 may form the second substrate structure 200.

The second wiring structure IS2 may be attached to the first wiring structure IS1. For example, as shown in FIG. 4, an upper face of the second wiring structure IS2 may be attached to a bottom face of the first wiring structure IS1.

The second wiring structure IS2 may be made up of one or more wirings. For example, the second wiring structure IS2 may include a second inter-wiring insulating film 230, and a plurality of wirings 232, 234 and 236 in the second inter-wiring insulating film 230. In FIG. 4, the number of layers of wiring constituting the second wiring structure IS2 and the arrangement thereof are merely examples, and are not limited thereto. The second inter-wiring insulating film 230 may include, e.g., at least one of silicon oxide, silicon nitride, silicon oxynitride, and a low dielectric constant (low-k) material having a lower dielectric constant than silicon oxide. In some embodiments, the second wiring structure IS2 may also include the same material as the first wiring structure IS1.

At least a part of the wirings 232, 234 and 236 of the second wiring structure IS2 may be connected to the second electronic element TR2. In some embodiments, the second wiring structure IS2 may include a third wiring 232 in the sensor array region SAR, a fourth wiring 234 in the connection region CR, and a fifth wiring 236 in the pad region PR. In some embodiments, the fourth wiring 234 may be the uppermost wiring among the plurality of wirings in the connection region CR, and the fifth wiring 236 may be the uppermost wiring among the plurality of wirings in the pad region PR. The third wiring 232, the fourth wiring 234, and the fifth wiring 236 may independently include, e.g., at least one of tungsten (W), copper (Cu), aluminum (Al), gold (Au), silver (Ag), and alloys thereof.

The surface insulating film 140 may be formed on the first face 110*a* of the first substrate 110. The surface insulating film 140 may extend along the first face 110*a* of the first substrate 110. In some embodiments, at least a part of the surface insulating film 140 may come into contact with the pixel separation pattern 120.

The surface insulating film 140 may include an insulating material. For example, the surface insulating film 140 may include at least one of silicon oxide, silicon nitride, silicon oxynitride, aluminum oxide, hafnium oxide, and a combination thereof. Further, the surface insulating film 140 may be formed of multi-films.

The surface insulating film 140 may function as an antireflection film to prevent the reflection of light incident on the first substrate 110, thereby improving the light receiving rate of the photo diode PD. Further, the surface insulating film 140 may function as a flattening film to form the color filter 170 and the microlens 180, which will be described later, at a uniform height.

The color filter 170 may be formed on the surface insulating film 140 of the light-receiving region APS. In some embodiments, the color filters 170 may be arranged to correspond to each unit pixel, e.g., in a one-to-one correspondence. For example, a plurality of color filters 170 may be arranged two-dimensionally, e.g., in the form of a matrix, from a planar viewpoint.

The color filter 170 may have various color filters depending on the unit pixel. For example, the color filter 170 may be arranged in a Bayer pattern that includes a red color filter, a green color filter, and a blue color filter. However, this is only an example, and the color filter 170 may include a yellow filter, a magenta filter, and a cyan filter, and may further include a white filter.

The grid pattern 160 may be formed on the surface insulating film 140. The grid pattern 160 may be formed in a grid pattern from a planar viewpoint, and may be interposed between the plurality of color filters 170.

The grid pattern 160 may include a low refractive index material having a lower refractive index than silicon (Si). For example, the grid pattern 160 may include at least one of silicon oxide, aluminum oxide, tantalum oxide, and a combination thereof. The grid pattern 160 including the low refractive index material may improve the quality of the image sensor by refracting or reflecting the light which is obliquely incident on the image sensor.

In some embodiments, a first protective film 165 may be formed on the surface insulating film 140 and the grid pattern 160. The first protective film 165 may be interposed between the surface insulating film 140 and the color filter 170, and between the grid pattern 160 and the color filter 170. For example, the first protective film 165 may extend along the profile of the upper face of the surface insulating film 140, and the side faces and upper face of the grid pattern 160. The first protective film 165 may include, e.g., aluminum oxide. The first protective film 165 may prevent damage to the surface insulating film 140 and the grid pattern 160.

The microlens 180 may be formed on the color filter 170. The microlens 180 may be arranged to correspond to each unit pixel, e.g., in a one-to-one correspondence. For example, the microlens 180 may be arranged two-dimensionally from a planar viewpoint, e.g., in the form of a matrix.

The microlens 180 may have a convex shape, and may have a predetermined radius of curvature. As a result, the microlens 180 may collect the light which is incident on the photo diode PD. The microlens 180 may include, e.g., a light-transmitting resin.

In some embodiments, a second protective film 185 may be formed on the microlens 180. The second protective film 185 may extend along the surface of the microlens 180. The second protective film 185 may include, e.g., an inorganic oxide film. For example, the second protective film 185 may include at least one of silicon oxide, titanium oxide, zirconium oxide, hafnium oxide, and a combination thereof. In some embodiments, the second protective film 185 may include a low temperature oxide (LTO).

The second protective film 185 may protect the microlens 180 from the outside. For example, the second protective film 185 may protect the microlens 180, which includes an organic material, by including an inorganic oxide film. Also, the second protective film 185 may improve the light collection capability of the microlens 180. For example, the second protective film 185 may reduce reflection, refraction, scattering, or the like of incident light that reaches the space between the microlenses 180, by filings the space between the microlenses 180.

A third trench 355*t* exposing the pixel separation pattern 120 may be formed in the first substrate 110 and the surface insulating film 140 of the light blocking region OB. A first connection structure 350 may be formed in the third trench 355*t* to contact the pixel separation pattern 120 in the light blocking region OB. The first connection structure 350 may extend along profiles of side and lower surfaces of the third trench 355*t*. A first pad 355 filling the third trench 355*t* may be formed on the first connection structure 350.

A fourth trench 455*t* exposing the second wiring 134 and the fourth wiring 234 may be formed in the first substrate structure 100 and the second substrate structure 200 of the connection region CR. The second connection structure 450 may be formed in the fourth trench 455*t* to connect the second wiring 134 and the fourth wiring 234. The second connection structure 450 may extend along profiles of side and lower surfaces of the fourth trench 455*t*. A first filling insulating layer 460 filling the fourth trench 455*t* may be formed on the second connection structure 450.

A sixth trench 555*t* may be formed in the first substrate 110 of the pad region PR. The third connection structure 550 may be formed and exposed in the sixth trench 555*t*. The third connection structure 550 may extend along profiles of side and lower surfaces of the fifth trench 550*t* and the sixth trench 555*t*. A second pad 555 filling the sixth trench 555*t* may be formed on the third connection structure 550. A second filling insulating layer 560 filling the fifth trench 550*t* may be formed on the third connection structure 550.

The second protective film 185 and a third protective layer 380 may expose the second pad 555. An exposure opening ER exposing the second pad 555 may be formed in the second protective film 185 and the third protective layer 380.

Figure 5:
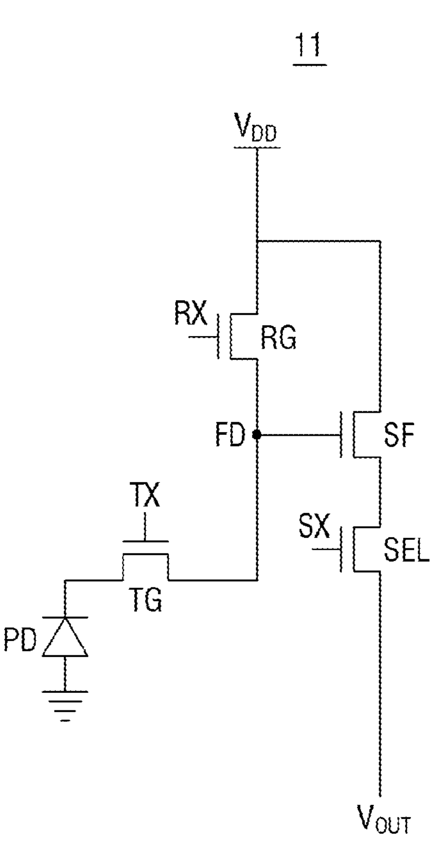
FIG. 5 is an exemplary circuit diagram of a unit pixel of the image sensor according to some embodiments.

FIG. 5 is an exemplary circuit diagram for explaining a unit pixel of the image sensor 1000. For example, FIG. 5 may be a circuit diagram of one unit pixel 11 of FIG. 3.

Referring to FIG. 5, each unit pixel 11 may include the photo diode PD, a transfer transistor TG1, a floating diffusion region FD, a reset transistor RG, a source follower transistor SF, and a selection transistor SEL.

The photo diode PD may generate electric charge in proportion to the amount of light that is incident from the outside. The photo diode PD may be coupled with the transfer transistor TG1 that transfers the generated and accumulated electric charge to the floating diffusion region FD. Since the floating diffusion region FD is a region which converts the electric charge into a voltage, and has a parasitic capacitance, the electric charge may be accumulatively stored.

One end of the transfer transistor TG1 may be connected to the photo diode PD, and the other end of the transfer transistor TG1 may be connected to the floating diffusion region FD. The transfer transistor TG1 may be formed of a transistor driven by a predetermined bias (e.g., the transfer signal TX1). That is, the transfer transistor TG1 may transfer the electric charge generated from the photo diode PD to the floating diffusion region FD according to the transfer signal TX1.

The source follower transistor SF may amplify a change in electrical potential of the floating diffusion region FD to which the electric charge is transferred from the photo diode PD, and output it to an output line $V_{OUT}$. When the source follower transistor SF is turned on, a predetermined electrical potential provided to a drain of the source follower transistor SF, e.g., a power supply voltage VDD, may be transferred to the source region of the selection transistor SEL.

The selection transistor SEL may select a unit pixel to be read on a row basis. The selection transistor SEL may be made up of a transistor that is driven by a selection line that applies a predetermined bias (e.g., a row selection signal SX).

The reset transistor RG may periodically reset the floating diffusion region FD. The reset transistor RG may be made up of a transistor that is driven by a reset line that applies a predetermined bias (e.g., a reset signal RX). When the reset transistor RG is turned on by the reset signal RX, a predetermined electrical potential provided to the drain of the reset transistor RG, e.g., the power supply voltage VDD, may be transferred to the floating diffusion region FD.

Figure 6:
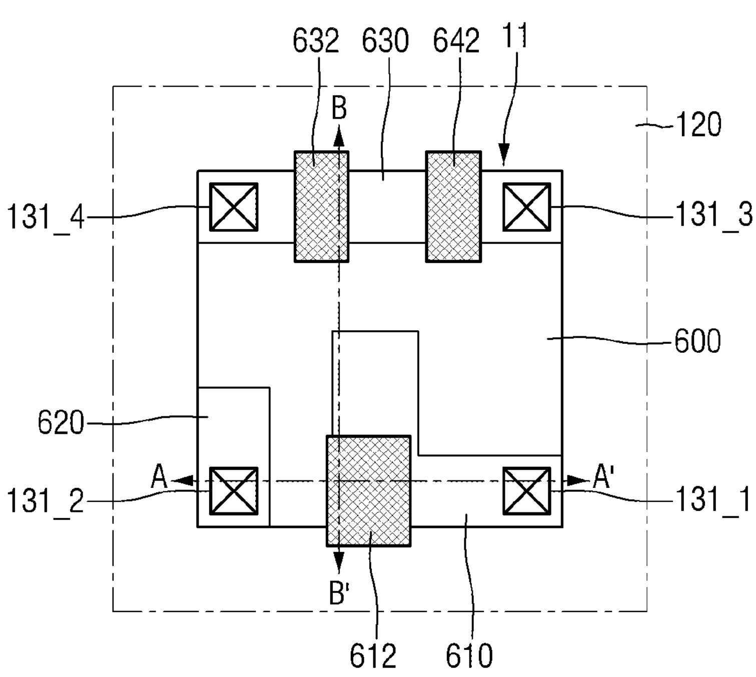
FIG. 6 is a plan view of an image sensor according to some embodiments.
Figure 7:
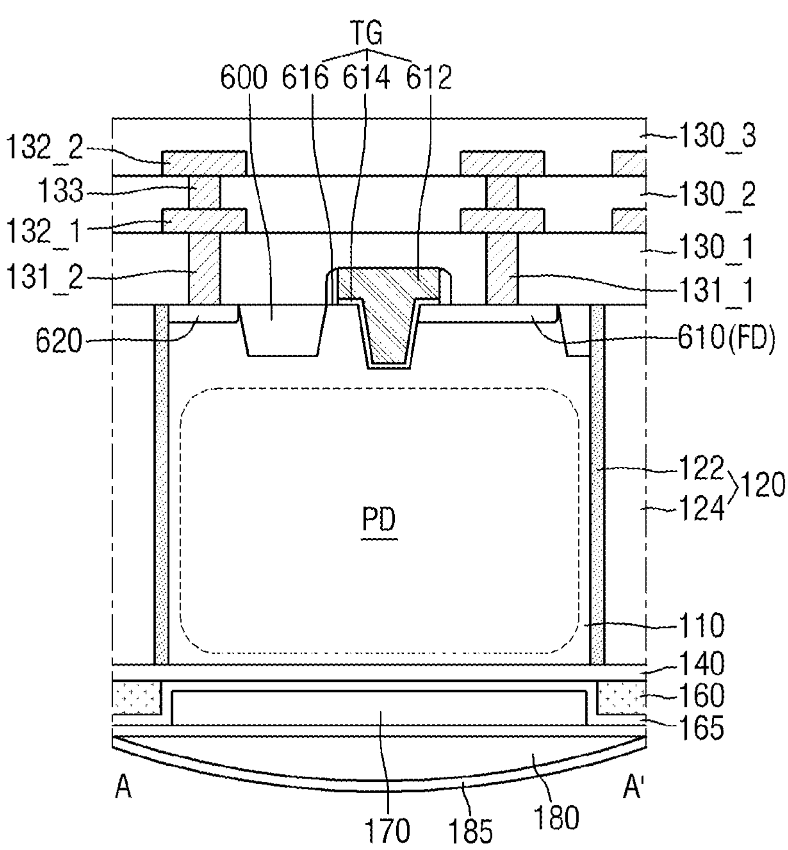
FIG. 7 is a cross-sectional view along line A-A' of FIG. 6.
Figure 8:
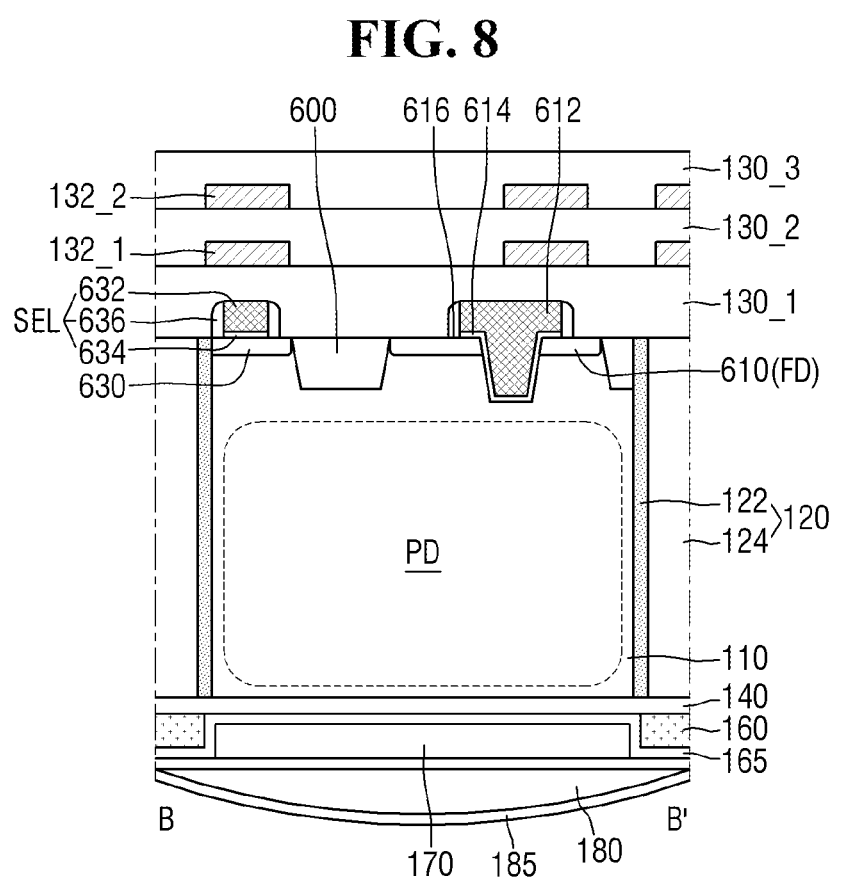

FIG. 6 is a plan view for explaining an image sensor according to some embodiments. FIG. 7 is a cross-sectional view taken along line A-A' of FIG. 6. FIG. 8 is a cross-sectional view taken along line B-B' of FIG. 6. For example, FIG. 6 may be a plan view of one unit pixel 11 of FIG. 3. It is noted that FIGS. 7 and 8 are vertically inverted relative to FIG. 4.

Referring to FIGS. 6 to 8, the unit pixel 11 of the image sensor 1000 may include an element separation pattern 600, a first active region 610, a ground region 620, and a second active region 630.

For example, the first substrate 110 may be a substrate in which a first conductivity type epitaxial layer is formed on a first conductivity type, e.g., a P-type bulk silicon substrate, and may be a substrate in which a bulk silicon substrate is removed and only the P-type epitaxial layer remains in the fabricating process of the image sensor. In another example, the first substrate 110 may also be a bulk semiconductor substrate including a well of the first conductivity type.

The photo diode PD may be formed in the first substrate 110. The photo diode PD may be formed by doping the first substrate 110 with impurity of a second conductivity type different from that of the first substrate 110. For example, the photo diode PD may be an N-type impurity region.

The first active region 610 and the second active region 630 may be formed in the first substrate 110. The first active region 610 and the second active region 630 may be formed by doping the first substrate 110 with impurity of the second conductivity type different from that of the first substrate 110.

The floating diffusion region FD may be formed in the first active region 610. The floating diffusion region FD may be placed adjacent to the transfer gate electrode 612. The floating diffusion region FD may be placed on one side of the transfer gate electrode 612. The floating diffusion region FD may be formed by doping impurity of the second conductivity type in the first substrate 110. For example, the floating diffusion region FD may be an N-type impurity region.

The element separation pattern 600 may be placed inside the pixel separation pattern 120. For example, the element separation pattern 600 may be placed within an area of a single unit pixel surrounded by the pixel separation pattern 120, e.g., as viewed in a top view. The element separation pattern 600 may define the first active region 610, the ground region 620, and the second active region 630 inside, e.g., within an area surrounded by, the pixel separation pattern 120. For example, as illustrated in FIG. 6, the element separation pattern 600 may continuously extend within the area surrounded by the pixel separation pattern 120 to define the first active region 610, the ground region 620, and the second active region 630, such that the first active region 610, the ground region 620, and the second active region 630 may be separated from each other by the element separation pattern 600.

The element separation pattern 600 may surround, e.g., at least a part of the periphery of, the first active region 610, at least a part of the ground region 620, and at least a part of the second active region 630, as viewed from a planar viewpoint. A part of the periphery of the first active region 610 may be in contact with the element separation pattern 600, and the remaining part thereof may be in contact with the pixel separation pattern 120. A part of the periphery of the ground region 620 may be in contact with the element separation pattern 600, and the remaining part may be in contact with the pixel separation pattern 120. The entire (or partial) periphery of the second active region 630 may be in contact with the element separation pattern 600. As a result, the first active region 610, the ground region 620, and the second active region 630 may be electrically insulated from each other by the element separation pattern 600.

A depth of the pixel separation pattern 120 may be deeper than that of the element separation pattern 600. For example, the pixel separation pattern 120 may be formed by a DTI (Deep Trench Isolation) process, and the element separation pattern 600 may be formed by an STI (Shallow Trench Isolation) process.

The transfer transistor TG1 may be placed on the first active region 610. The transfer transistor TG1 may include a transfer gate electrode 612, a transfer gate insulating film 614, and a transfer gate spacer 616. The transfer gate insulating film 614 may be interposed between the transfer gate electrode 612 and the first substrate 110 or the floating diffusion region FD. The transfer gate electrode 612 may be formed on the transfer gate insulating film 614. The transfer gate spacer 616 may extend along the side faces of the transfer gate electrode 612 and the transfer gate insulating film 614. In some embodiments, the width of the transfer gate electrode 612 may decrease in a direction from the microlens 180 toward the first substrate 110.

In some embodiments, the transfer transistor may be a vertical transfer transistor. For example, the transfer gate electrode 612 may partially extend into the first substrate 110. The transfer gate electrode 612 may include a lower portion inserted into the first substrate 110, and an upper portion connected to the lower portion and protruding from the first substrate 110. Such a transfer transistor may reduce an area of the unit pixel to enable high integration of the image sensor.

The ground region 620 may supply the ground voltage required for the operation of the unit pixel 11. For example, a ground voltage contact 135_2 may supply the ground voltage to one end of the photo diode PD. The ground region 620 may be an impurity region of the first conductivity type. For example, the ground region 620 may be a P-type impurity region.

The gate electrode 632 of the selection transistor SEL may be placed on the second active region 630. The selection transistor SEL may include the gate electrode 632, a gate insulating film 634, and a gate spacer 636. The gate insulating film 634 may be formed on the second active region 630. The gate spacer 636 may extend along the side faces of the gate electrode 632 and the gate insulating film 634.

The gate electrode 642 of the source follower transistor may be placed on the second active region 630. That is, the unit pixel 11 may include three transistors.

The first inter-wiring insulating film (130 of FIG. 4) may include a plurality of insulating layers 130_1, 130_2, and 130_3. The plurality of insulating layers 130_1, 130_2, and 130_3 may be sequentially stacked on the first substrate 110. The insulating layer 130_1 may be placed on the first substrate 110 to cover the transfer transistor TG1, the selection transistor SEL, and the source follower transistor.

The first wiring (132 of FIG. 4) may include a plurality of wiring layers 132_1 and 132_2. The wiring layers 132_1 and 132_2 may each be placed in the insulating layers 130_1 and 130_2, respectively. A via 133 may penetrate the insulating layer 130_2 to connect the contacts 131_1, 131_2, 131_3, and 131_4 and the wiring layers 132_1 and 132_2.

The first contact 131_1 penetrates the insulating layer 130_1 and may be connected to the floating diffusion region FD. The second contact 131_2 penetrates the insulating layer 130_1 and may be connected to the ground region 620. The ground region 620 may be connected to a ground voltage terminal by the second contact 131_2. The third contact 131_3 and the fourth contact 131_4 penetrate the insulating layer 130_1, and may be connected to the second active region 630. The third contact 131_3 may be connected to the source region of the source follower transistor, and the source region of the source follower transistor may be connected to the power supply voltage terminal by the third contact 131_3. The fourth contact 131_4 may be connected to the drain region of the selection transistor, and the drain region of the selection transistor may be connected to the output terminal by the fourth contact 131_4.

As the image sensors are highly integrated, the size of the unit pixel gradually decreases. Thus, if the first active region 610 were to be connected to the second active region 630, potential between the floating diffusion region FD and the output terminal could be reduced by a difference in voltage applied to the image sensor, thereby causing leak of the electric charge from the floating diffusion region FD to the output terminal. While the decrease in potential could be improved by injecting impurity of the first conductivity type into a connection region between the first active region 610 and the second active region 630, the resultant increased potential between the floating diffusion region FD and the transfer gate electrode of the transfer transistor could cause disturbance in the movement of electric charge, thereby causing potential barrier phenomenon.

In contrast, according to example embodiments, by separating the first active region 610 and the second active region 630 by the element separation pattern 600, the image sensor according to some embodiments can prevent the electric charge from leaking from the floating diffusion region FD to the output terminal, without a process of injecting the impurity. Also, since the space between the first active region 610 and the second active region 630 increases, e.g., as compared with a case where the first active region 610 and the second active region 630 are connected, a phenomenon in which voids are generated in a banding portion of the second active region 630 can be improved.

Figure 9:
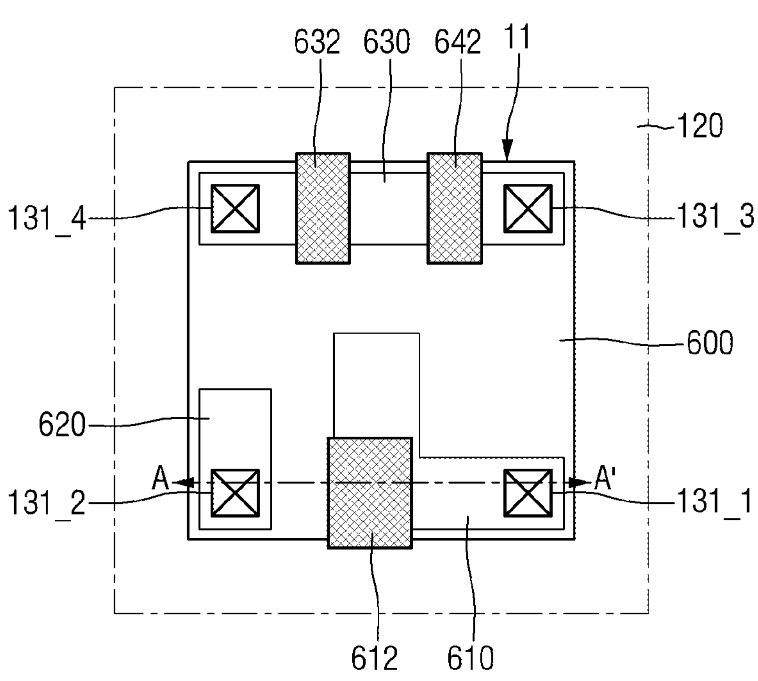
FIG. 9 is a plan view of an image sensor according to some embodiments.
Figure 10:
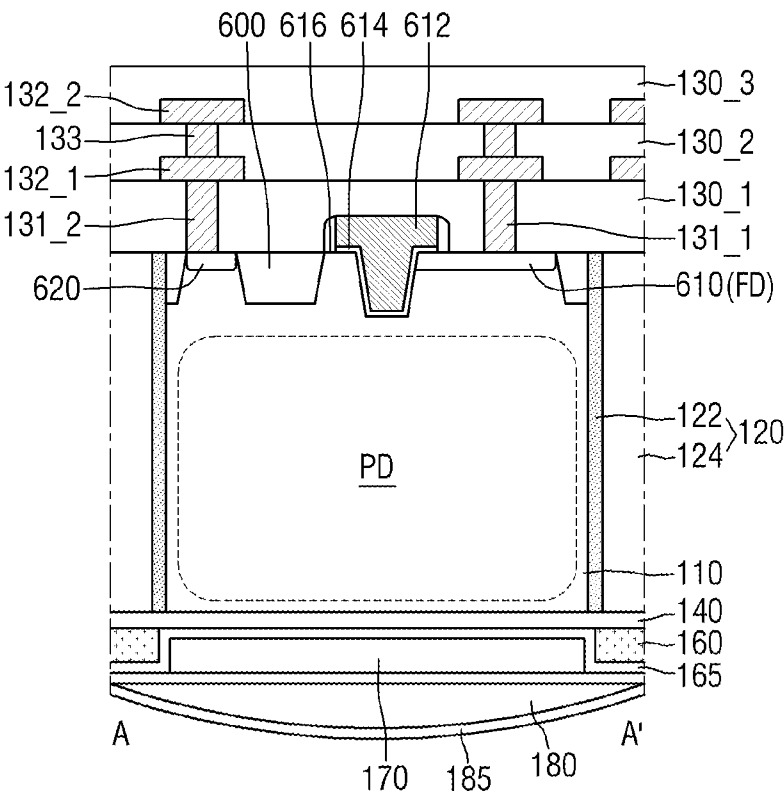
FIG. 10 is a cross-sectional view along line A-A' of FIG. 9

FIG. 9 is a plan view of an image sensor according to some embodiments. FIG. 10 is a cross-sectional view taken along line A-A' of FIG. 9. For convenience of explanation, differences from those described referring to FIGS. 1 to 8 will be mainly described.

Referring to FIGS. 9 and 10, the element separation pattern 600 may, e.g., completely, surround all the peripheries of the first active region 610, the ground region 620, and the second active region 630 from a planar viewpoint. The element separation pattern 600 may be formed between the first active region 610, the ground region 620, the second active region 630, and the pixel separation pattern 120. That is, the first active region 610, the ground region 620, and the second active region 630 may be spaced apart from the pixel separation pattern 120 by the element separation pattern 600.

Figure 11:
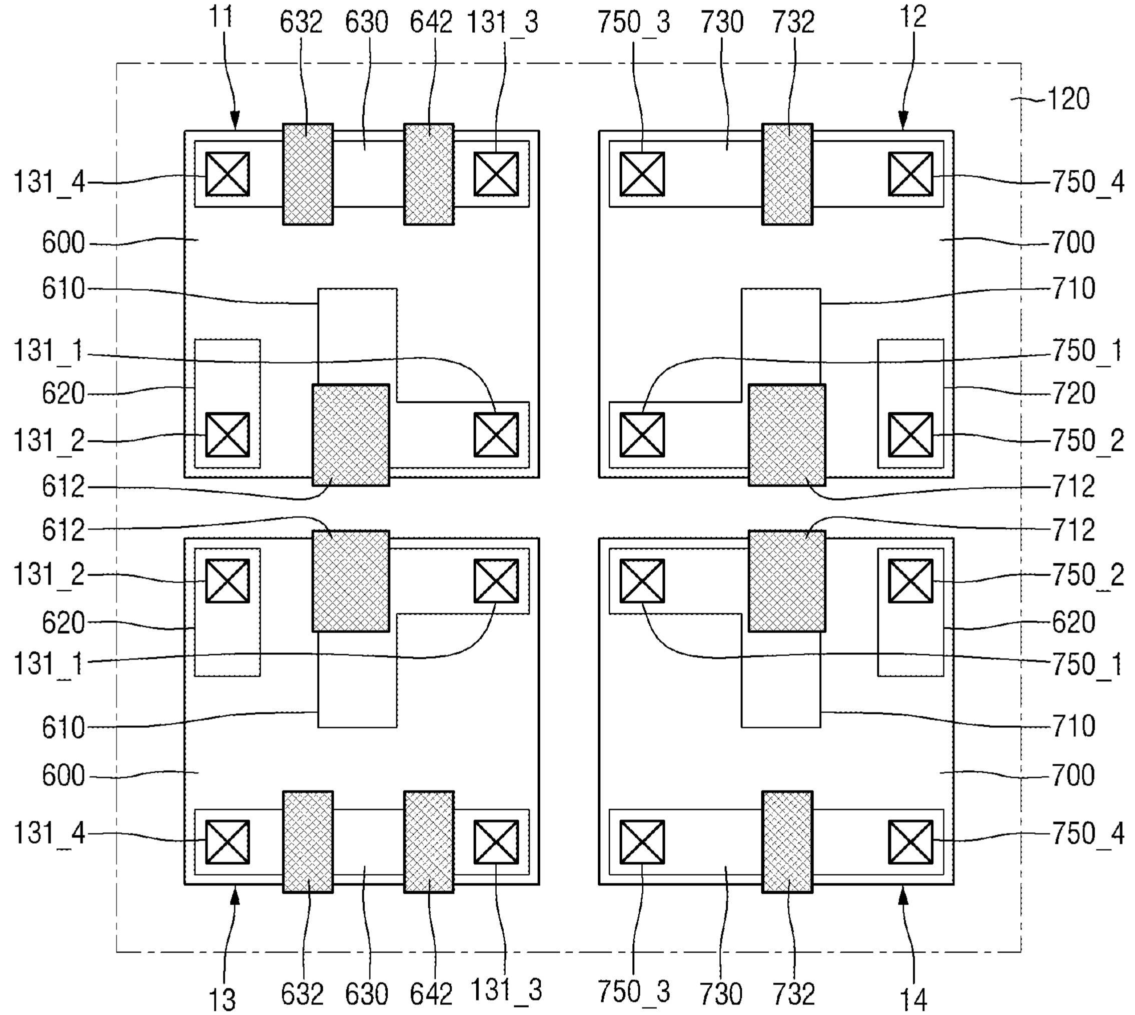
FIG. 11 is a plan view of an image sensor according to some embodiments.

FIG. 11 is a plan view of an image sensor according to some embodiments. For convenience of explanation, differences from those described referring to FIGS. 1 to 10 will be mainly described.

Referring to FIG. 11, the image sensor according to some embodiments may include first to fourth unit pixels 11, 12, 13, and 14. The first to fourth unit pixels 11, 12, 13, and 14 may be arranged in the form of a matrix, e.g., from a planar viewpoint. The first to fourth unit pixels 11, 12, 13, and 14 may be electrically separated by the pixel separation pattern 120.

The first and third unit pixels 11 and 13 may have the same structure as the unit pixels described above. The second and fourth unit pixels 12 and 14 may include a second element separation pattern 700, a third active region 710, a second ground region 720, and a fourth active region 730.

The second element separation pattern 700 may be placed inside, e.g., to be surrounded by, the pixel separation pattern 120 to define the third active region 710, the second ground region 720, and the fourth active region 730. The third active region 710, the second ground region 720, and the fourth active region 730 may be electrically insulated from each other by the second element separation pattern 700.

A second transfer gate electrode 712 of the second transfer transistor may be placed on the third active region 710. The fourth contact 750_1 may be connected to the floating diffusion region in the third active region 710.

A second ground voltage contact 750_2 on the second ground region 720 may supply the ground voltage to one end of the photo diode in the second unit pixel 12.

The gate electrode 732 of the reset transistor may be placed on the fourth active region 730. A fifth contact 750_3 may be connected to the drain region of the reset transistor and may be connected to the fourth contact 750_1. Therefore, the drain of the reset transistor may be connected to the floating diffusion region. A sixth contact 750_4 may be connected to the source region of the reset transistor, and the source region of the reset transistor may be connected to the power supply voltage terminal by the sixth contact 750_4.

The first unit pixel 11 and the second unit pixel 12 may share the floating diffusion region. For example, the first contact 131_1 of the first unit pixel 11 may be connected to the fourth contact 750_1 and the fifth contact 750_3 of the second unit pixel 12. The third and fourth unit pixels 13 and 14 may also share the floating diffusion region, like the first and second unit pixels 11 and 12. Alternatively, each of the second and fourth unit pixels 12 and 14 may be placed below the first and third unit pixels 11 and 13.

Figure 12:
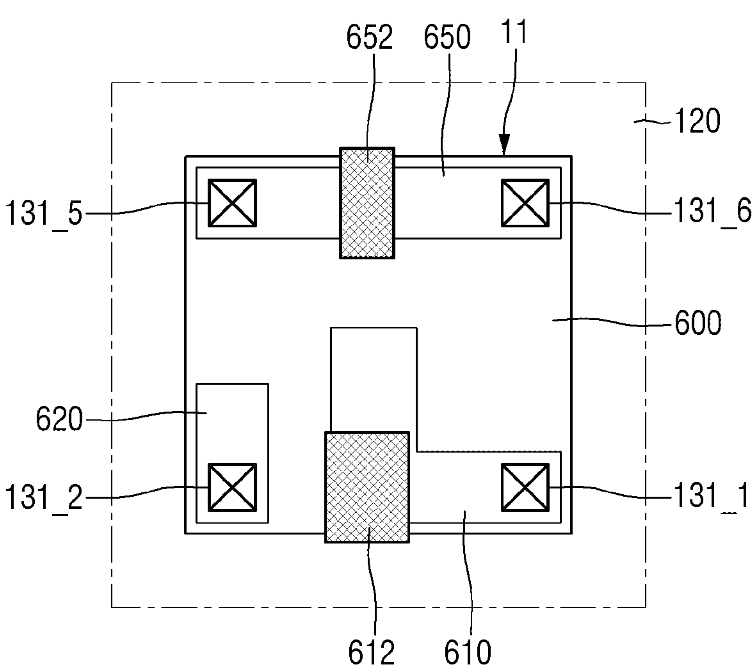
FIG. 12 is a plan view of an image sensor according to some embodiments.

FIG. 12 is a plan view of an image sensor according to some embodiments. For convenience of explanation, differences from those described referring to FIGS. 1 to 10 will be mainly described.

Referring to FIG. 12, the unit pixel 11 of the image sensor according to some embodiments may include the element separation pattern 600, the first active region 610, the ground region 620, and a third active region 650. The first active region 610, the ground region 620, and the third active region 650 may be electrically insulated by the element separation pattern 600.

A gate electrode 652 of the transistor may be placed on the third active region 650. The transistor may be, e.g., one of a selection transistor, a source follower transistor, and a reset transistor. That is, the unit pixel 11 may include two transistors. The source region of the transistor may be connected to a third contact 131_5, and the drain region may be connected to a fourth contact 131_6.

Figure 13:
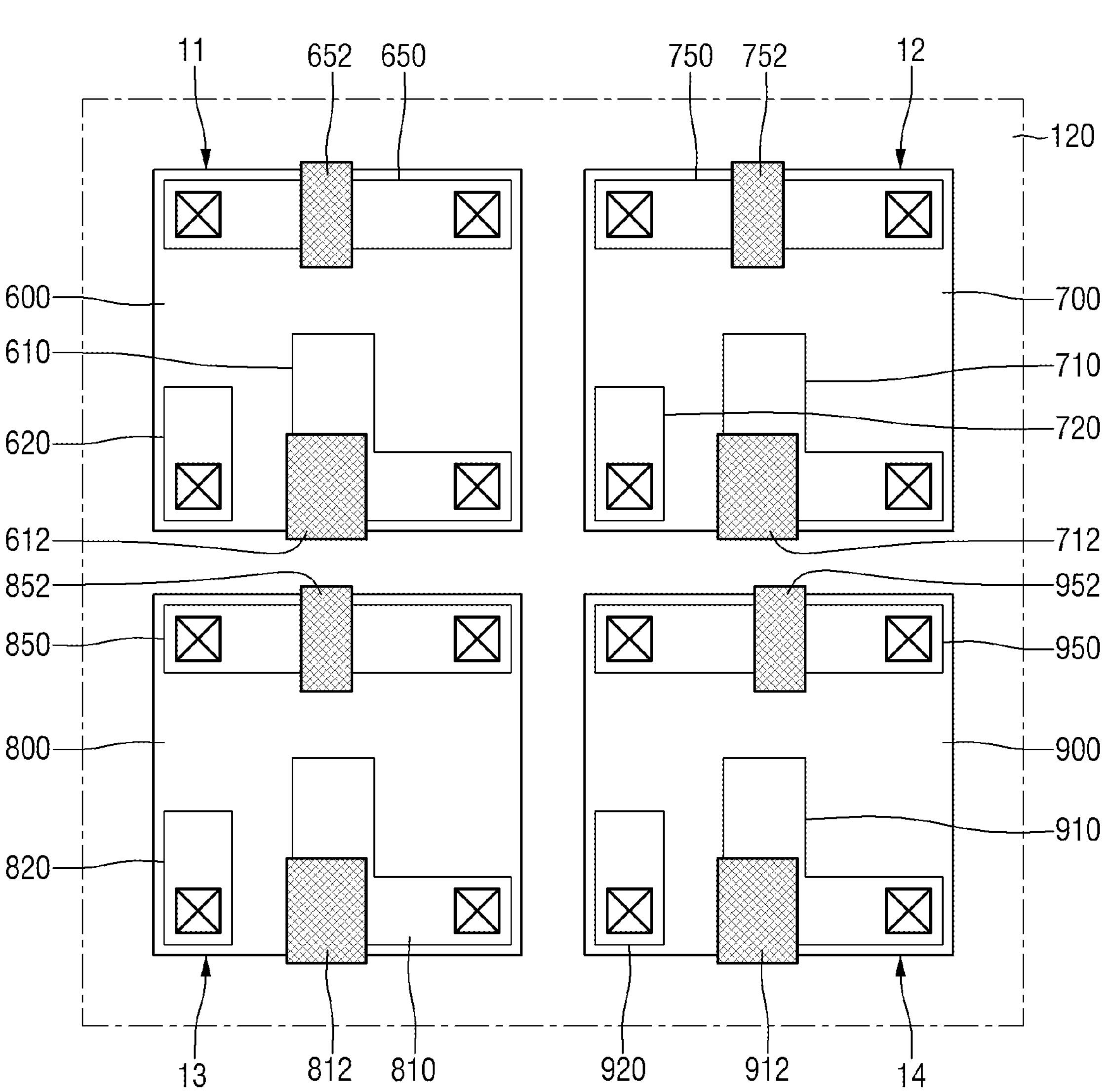
FIG. 13 is a plan view of an image sensor according to some embodiments.

FIG. 13 is a plan view of an image sensor according to some embodiments. For convenience of explanation, differences from those described referring to FIGS. 1 to 11 will be mainly described.

Referring to FIG. 13, the first to fourth unit pixels 11, 12, 13, and 14 may each include element separation patterns 600, 700, 800, and 900, first active regions 610, 710, 810, and 910, ground regions 620, 720, 820, and 920, and third active regions 650, 750, 850, and 950.

The transfer gate electrodes 612, 712, 812, and 912 of the transfer transistor may each be placed on the first active regions 610, 710, 810, and 910. The gate electrodes 652, 752, 852, and 952 of the transistor may be placed on the third active regions 650, 750, 850, and 950. The transistors included in the first to fourth unit pixels 11, 12, 13, and 14 may each perform different roles. For example, the gate electrode 652 of the first unit pixel 11 may be a gate electrode of the reset transistor, the gate electrode 752 of the second unit pixel 12 may be a gate electrode of the source follower transistor, the gate electrode 852 of the third unit pixel 13 may be a gate electrode of the selection transistor, and the gate electrode 952 of the fourth unit pixel 14 may be a gate electrode of a dummy transistor in which both the source region and the drain region are connected to the ground region. The present disclosure is not limited thereto, and some of the transistors included in the first to fourth unit pixels 11, 12, 13, and 14 may have the same role as the same transistor.

The first to fourth unit pixels 11, 12, 13, and 14 may share the floating diffusion region. For example, contacts connected to the floating diffusion region in the first to fourth unit pixels 11, 12, 13, and 14 may be connected to each other.

Figure 14:
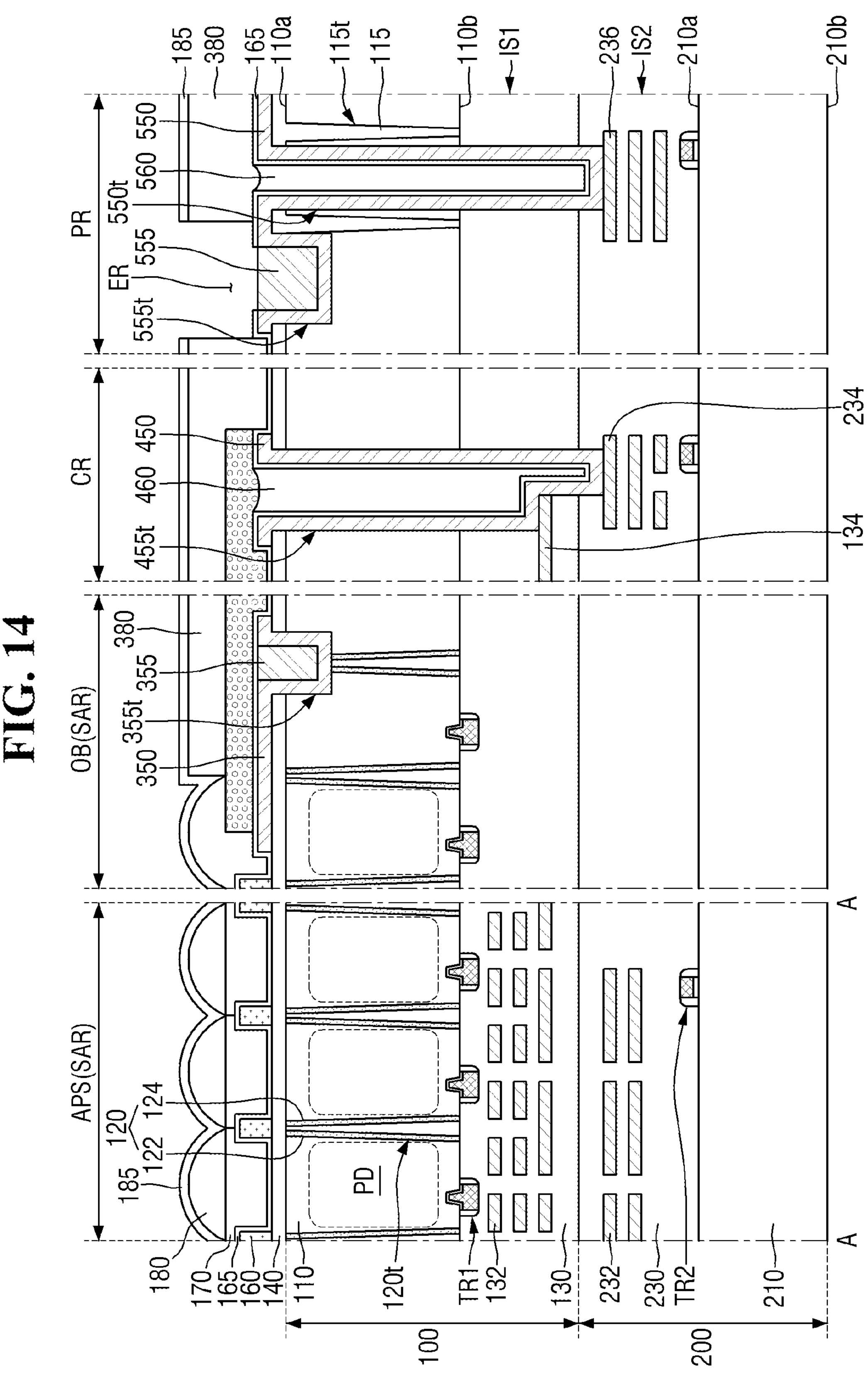
FIGS. 14 to 16 are cross-sectional views of an image sensor according to some embodiments.
Figure 15:
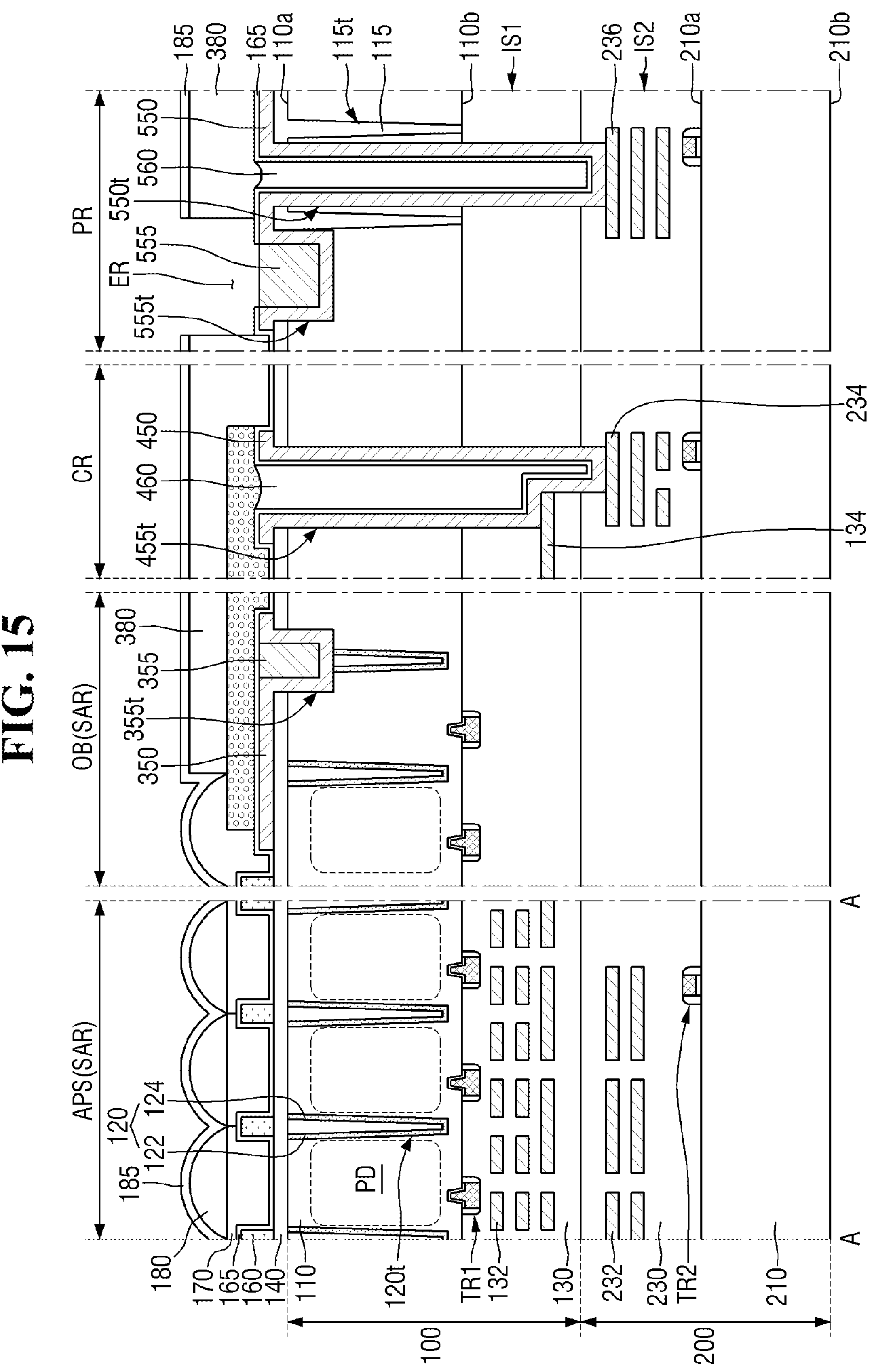
Figure 16:
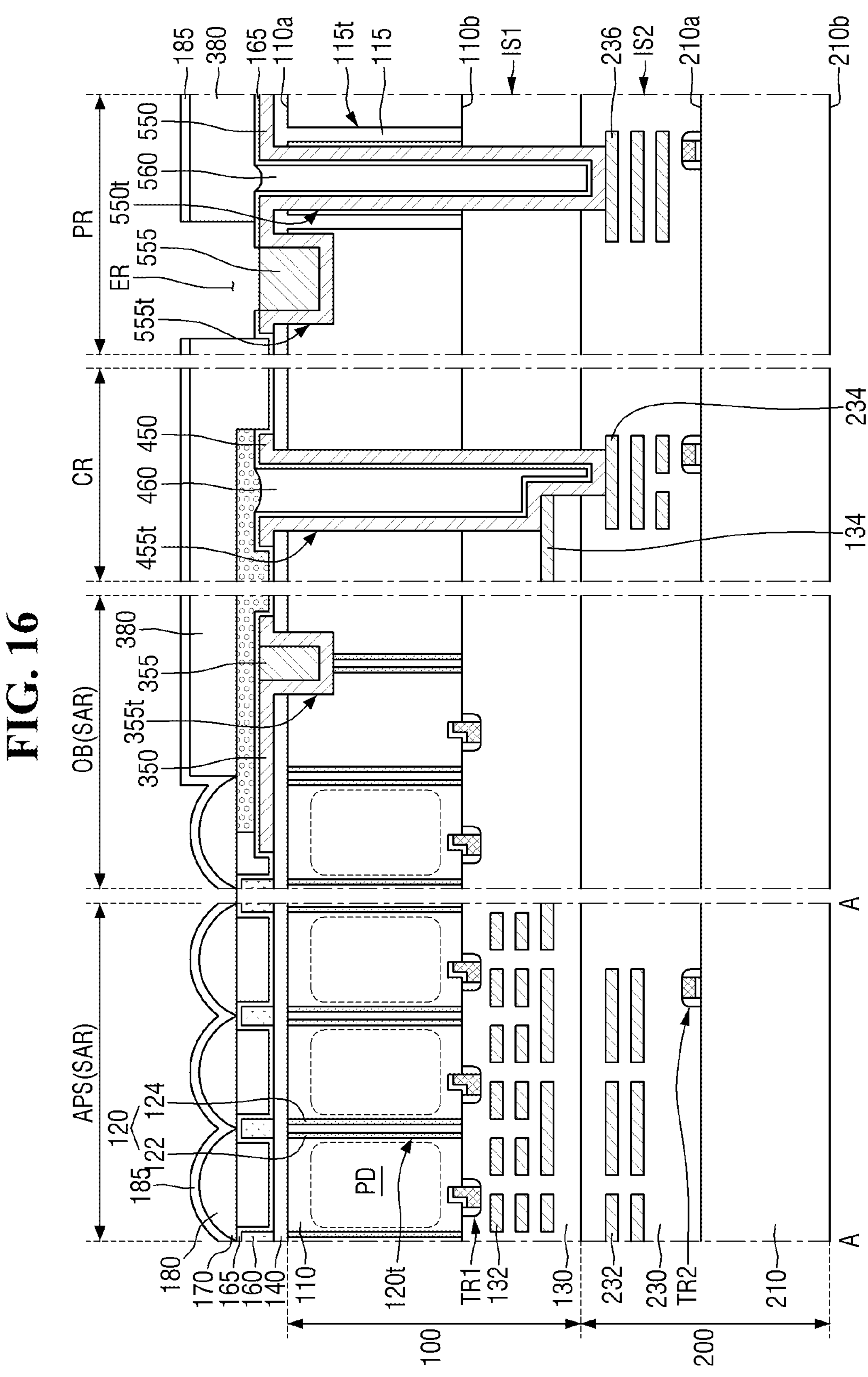

FIGS. 14 to 16 are cross-sectional views of an image sensor according to some embodiments. FIGS. 14 to 16 are cross-sectional views taken along line A-A of FIG. 3 and line B-B of FIG. 2, for explaining the light-shielding region, the connection region, and the pad region of FIG. 2. For convenience of explanation, differences from those described referring to FIGS. 1 to 13 will be mainly described.

Referring to FIG. 14, in the image sensor according to some embodiments, the width of the pixel separation pattern 120 may decrease in the direction from the second face 110*b* of the first substrate 110 toward the first face 110*a* of the first substrate 110. This may be due to the characteristics of the etching process for forming the pixel separation pattern 120. For example, the process of etching the first substrate 110 to form the pixel separation pattern 120 may be performed on the second face 110*b* of the first substrate 110.

Referring to FIG. 15, in the image sensor according to some embodiments, the width of the pixel separation pattern 120 may decrease in the direction from the first face 110*a* of the first substrate 110 toward the second face 110*b* of the first substrate 110. This may be due to the characteristics of the etching process for forming the pixel separation pattern 120. For example, the process of etching the first substrate 110 to form the pixel separation pattern 120 may be performed on the first face 110*a* of the first substrate 110.

In some embodiments, the pixel separation pattern 120 may not completely penetrate the first substrate 110. For example, the pixel separation pattern 120 may extend from the first face 110*a* of the first substrate 110, but may not extend to the second face 110*b* of the first substrate 110. That is, the lowermost face of the pixel separation pattern 120 may be spaced apart from the second face 110*b* of the first substrate 110.

Referring to FIG. 16, in the image sensor according to some embodiments, the grid pattern 160 may completely separate the plurality of color filters 170. For example, the grid pattern 160 and the first protective film 165 extending along the profile of the grid pattern 160 may be interposed between the plurality of color filters 170 to completely separate the plurality of color filters 170 from each other. Although the upper face of the color filter 170 is shown as only being the same as the uppermost face of the first protective film 165, this is only an example. For example, the upper face of the color filter 170 may, of course, be formed to be lower than the uppermost face of the first protective film 165.

By way of summation and review, aspects of the present disclosure provide an image sensor having improved product reliability, as well as an image processing device including the same. That is, according to embodiments, the active areas of transistors and a ground region within each unit pixel of the image sensor are completely separated from each other by an element separation patterns, thereby preventing electric charge leakage and minimizing generation of voids in a banding portion of the active regions.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An image sensor, comprising:

a substrate including:

an element separation pattern, a first active region, and a ground region, the ground region being separated from the first active region by the element separation pattern;

a transfer transistor including a transfer gate electrode on the first active region, the transfer gate electrode being separated from the ground region by the element separation pattern;

a photo diode within the substrate, the photo diode being spaced apart from the transfer gate electrode; and a contact on the ground region, the contact being configured to receive a ground voltage, wherein:

the substrate further includes a second active region separated from the first active region and the ground region by the element separation pattern, and the image sensor further includes a first transistor and a second transistor on the second active region, the first transistor and the second transistor being spaced apart from each other, the substrate further includes:

a pixel separation pattern; and pixel regions separated by the pixel separation pattern, each of the pixel regions including a portion of the pixel separation pattern, the first active region, and the ground region, and the ground region or the first active region is in contact with the pixel separation pattern.

2. The image sensor as claimed in claim 1, wherein the element separation pattern surrounds the first active region and the ground region.

3. The image sensor as claimed in claim 1, wherein a depth of the element separation pattern is shallower than a depth of the transfer gate electrode.

4. The image sensor as claimed in claim 1, wherein at least a part of the transfer gate electrode extends into the substrate.

5. The image sensor as claimed in claim 4, wherein a depth of the pixel separation pattern is deeper than a depth of the element separation pattern.

6. The image sensor as claimed in claim 5, wherein the ground region or the first active region is spaced apart from the pixel separation pattern by the element separation pattern.

7. The image sensor as claimed in claim 5, wherein the ground region or the first active region is connected to the pixel separation pattern.

8. The image sensor as claimed in claim 5, wherein the substrate further includes a first face and a second face opposite to each other, the pixel separation pattern extending from the first face to the second face and being in contact with the first face and the second face.

9. The image sensor as claimed in claim 8, wherein a width of the pixel separation pattern increases from the first face toward the second face.

10. The image sensor as claimed in claim 5, wherein the substrate further includes a first face and a second face opposite to each other, the pixel separation pattern extending from the first face to the second face, and being in contact with the first face but not with the second face.

11. The image sensor as claimed in claim 10, wherein a width of the pixel separation pattern decreases from the first face toward the second face.

12. An image sensor, comprising:

a substrate;

a first pixel region on the substrate, the first pixel region including a first active region, a second active region, and a first ground region, and the first active region, the second active region, and the first ground region being separated from each other by a first element separation pattern;

a first transfer transistor on the first active region, the first transfer transistor including a first transfer gate electrode at least partially extending into the substrate, and the first transfer gate electrode being separated from the first ground region by the first element separation pattern;

a first photo diode within the substrate and spaced part from the first transfer gate electrode;

a source follower transistor on the second active region, the source follower transistor including:

a first end connected to a power supply voltage terminal, and a gate connected to a floating diffusion region; and a selection transistor on the second active region and spaced apart from the source follower transistor, the selection transistor including:

a first end connected to a second end of the source follower transistor, and a contact on the first ground region, the contact being configured to receive a ground voltage, wherein the substrate further includes a pixel separation pattern, wherein the first pixel region includes a portion of the pixel separation pattern, and wherein the first ground region or the first active region is in contact with the pixel separation pattern.

13. The image sensor as claimed in claim 12, wherein:

the floating diffusion region is on the first active region, the second active region further includes the power supply voltage terminal and an output voltage terminal, the power supply voltage terminal being configured to receive a power supply voltage, and the output voltage terminal being configured to output an output voltage, and a second end of the selection transistor is connected to the output voltage terminal.

14. The image sensor as claimed in claim 12, wherein the first element separation pattern surrounds the first active region, the second active region, and the first ground region, as viewed from a planar viewpoint.

15. The image sensor as claimed in claim 12, wherein:
the first pixel region further includes a third active region separated by the first element separation pattern, and
the image sensor further includes a reset transistor on the third active region, the reset transistor including a first end connected to the power supply voltage terminal, and a second end connected to the floating diffusion region.

16. The image sensor as claimed in claim 12, wherein:
the substrate further includes:
a second pixel region separated from the first pixel region by the pixel separation pattern, the second pixel region having a fourth active region, a fifth active region, and a second ground region separated by a second element separation pattern, and
a second photo diode in the substrate,
the fourth active region includes a second transfer transistor including a second transfer gate electrode which at least partially extends into the substrate and is spaced apart from the second photo diode,
the fifth active region includes a reset transistor which has a first end connected to the power supply voltage terminal, and a second end connected to the floating diffusion region, and
the second ground region is separated from the second transfer gate electrode by the second element separation pattern.

17. The image sensor as claimed in claim 16, wherein the second element separation pattern surrounds the fourth active region, the fifth active region, and the second ground region, as viewed from a planar viewpoint.

18. An image processing device, comprising:
an image sensor with pixel regions, each of the pixel regions having a photo diode configured to generate an electric charge from light, and to generate a pixel signal from the electric charge; and
an image processor configured to generate an image data from the pixel signal,
wherein the image sensor includes:
a substrate having an element separation pattern, a first active region, and a ground region separated by the element separation pattern,
a transfer transistor having a transfer gate electrode which at least partially extends into the substrate and overlaps the photo diode, and
a contact on the ground region and configured to receive a ground voltage,
wherein the element separation pattern surrounds the first active region or the ground region, and
wherein the ground region is separated from the transfer gate electrode by the element separation pattern,
wherein the substrate further includes a second active region separated from the first active region and the ground region by the element separation pattern,
wherein the image sensor further includes a first transistor and a second transistor on the second active region, the first transistor and the second transistor being spaced apart from each other,
wherein the substrate further includes a pixel separation pattern,
wherein the pixel regions are separated by the pixel separation pattern, each of the pixel regions including a portion of the pixel separation pattern, and
wherein the ground region or the first active region is in contact with the pixel separation pattern.

* * * * *